US012574024B2

(12) United States Patent
Jain et al.

(10) Patent No.: US 12,574,024 B2
(45) Date of Patent: Mar. 10, 2026

(54) PULSE WIDTH MODULATION SIGNAL DRIVER

(71) Applicant: Infineon Technologies Canada Inc., Ottawa (CA)

(72) Inventors: Abhishek Jain, Delhi (IN); Ramesh G. Karpur, Bangalore (IN); Ashutosh Kumar, Patna (IN); Suraj Somashekara Kumar, Bantwal Taluk (IN); Ashutosh Ravindra Joharapurkar, Bangalore (IN)

(73) Assignee: Infineon Technologies Canada Inc., Ottawa (CA)

( * ) Notice: Subject to any disclaimer, the term of this patent is extended or adjusted under 35 U.S.C. 154(b) by 196 days.

(21) Appl. No.: 18/493,653

(22) Filed: Oct. 24, 2023

(65) Prior Publication Data

US 2025/0132656 A1      Apr. 24, 2025

(51) Int. Cl.
| | |
|---|---|
| *H03K 9/08* | (2006.01) |
| *H03F 3/217* | (2006.01) |
| *H03K 7/06* | (2006.01) |
| *H03K 7/08* | (2006.01) |
| *H03K 19/0175* | (2006.01) |

(Continued)

(52) U.S. Cl.
CPC .............. *H03K 9/08* (2013.01); *H03F 3/217* (2013.01); *H03F 3/2171* (2013.01); *H03K 7/06* (2013.01); *H03K 7/08* (2013.01); *H03K 19/017509* (2013.01); *H04L 25/0266* (2013.01); *H04L 25/4902* (2013.01); *H03F 2200/351* (2013.01)

(58) Field of Classification Search
CPC ... H03K 7/06; H03K 7/08; H03K 9/08; H03F 3/217; H03F 3/2171; H03F 2200/351; H04L 25/0266; H04L 25/4902
See application file for complete search history.

(56) References Cited

U.S. PATENT DOCUMENTS

| | | | |
|---|---|---|---|
| 9,143,373 B2 | 9/2015 | Sonntag et al. | |
| 10,749,509 B1 * | 8/2020 | Cascio ........... | H03K 19/018514 |

(Continued)

OTHER PUBLICATIONS

Extended European Search Report received for application No. / patent No. 24208326.9-1201 Mar. 26, 2025, 12 pages.

*Primary Examiner* — Gary L Laxton
(74) *Attorney, Agent, or Firm* — WORKMAN NYDEGGER

(57) ABSTRACT

An isolation driver circuit for a pulse width modulation signal. The isolation driver circuit includes a rising edge detection circuit, a falling edge detection circuit, and a decoder. The rising edge detection circuit and the falling edge detection circuit respectively detect rising edges and falling edges of the input pulse width modulation signal, and respectively output corresponding rising edge detection signals and falling edge detection signals that are capacitively isolated from the input pulse width modulation signal. The decoder receives the rising edge detection signals and the falling edge detection signals, and outputs respective rising edges and falling edges of an output pulse width modulation signal that temporally align with the respective rising edges and falling edges of the input pulse width modulation signal. Thus, information stored in the pulse widths of the input pulse width modulation signal are preserved with high fidelity in the output pulse width modulation signal.

10 Claims, 7 Drawing Sheets

600

(51) Int. Cl.
    *H04L 25/02*     (2006.01)
    *H04L 25/49*     (2006.01)

(56)         References Cited

U.S. PATENT DOCUMENTS

| | | |
|---|---|---|
| 11,502,718 B1 | 11/2022 | Li |
| 2022/0385258 A1 | 12/2022 | Zhan et al. |

* cited by examiner

PULSE WIDTH MODULATION SIGNAL DRIVER

BACKGROUND

Electronic circuits have conventionally been used to perform a wide variety of function, an example of which being analog signal amplification. Analog signal amplification may be useful when an original analog signal does not have sufficient power to properly drive an output device. Accordingly, to properly drive such an output device, the analog input signal may be passed through some sort of analog signal amplification circuit.

One type of analog signal amplification circuit is called a "class D amplifier", and is used commonly for amplifying audio signals to drive speakers or the like. A class D amplifier uses pulse width modulation (PWM) to transform a relatively small analog input signal into an amplified analog output signal via digital means. In the case of a class D amplifier, the relatively small analog input signal (an audio analog signal) is compared with a repeating triangular waveform to generate a pulse-width modulated signal where the pulse width at any given time represents the value of the analog input signal. The pulse-width modulated signal itself is then amplified by, for example, using a half bridge driver. The resulting amplified pulse width modulated signal is then passed through a low pass filter to extract an analog output signal that ideally is an amplified form of the analog input signal. That amplified analog output signal, having significantly more power than the analog input signal, may then be used to properly drive an audio output device.

The subject matter claimed herein is not limited to embodiments that solve any disadvantages or that operate only in environments such as those described above. Rather, this background is only provided to illustrate one example technology area where some embodiments described herein may be practiced.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Embodiments described herein relate to an isolation driver circuit for a pulse width modulation signal. The isolation driver circuit is configured to generate a rising edge of an output pulse width modulation signal in response to detecting a rising edge of an input pulse width modulation signal, and to generate a falling edge of the output pulse width modulation signal in response to detecting a falling edge of the input pulse width modulation signal. Moreover, the generation of the rising edge and the falling edge is performed such that the time between the rising edge and the falling edge for the output pulse width modulation signal is closer to the time between the rising edge and the falling edge of the input pulse width modulation signal. In other words, the pulse width of the input pulse width modulation signal is highly accurately preserved in the pulse width of the output pulse width modulation signal. Since information is represented in a pulse width modulation signal using pulse width, this means that the information present within the input pulse width modulation signal is preserved with high fidelity within the output pulse width modulation signal.

The isolation driver circuit includes a rising edge detection circuit, a falling edge detection circuit, and a decoder. The rising edge detection circuit detects rising edges of the input pulse width modulation signal, and outputs corresponding rising edge detection signals that are capacitively isolated from the input pulse width modulation signal. This may be accomplished by using a clock to modulate the input pulse width modulation signal where the clock signal has a rising edge that is coherent with the rising edge of the input pulse width modulation signal.

Likewise, the falling edge detection circuit detects falling edges of the input pulse width modulation signal, and outputs corresponding falling edge detection signals that are capacitively isolated from the input pulse width modulation signal. However, this is accomplished by using a separate clock signal to modulate the input pulse width modulation signal where the separate clock signal has a rising edge that is coherent with the falling edge of the input pulse width modulation signal (whereas the rising edge of the other clock signal has coherence with the rising edge of the input pulse width modulation signal).

As the decoder receives the rising edge detection signals from the rising edge detection circuit, the decoder outputs rising edges of the output pulse width modulation signal. Similarly, as the decoder receives the falling edge detection signals from the falling edge detection circuit, the decoder outputs falling edges of the output pulse width modulation signal. Accordingly, the decoder generates a rising edge in the output signal that temporally aligns with the rising edge of the input signal, and a falling edge in the output signal that temporally aligns with the falling edge of the input signal. This more accurately preserves the pulse width and thus allows information to be conveyed with higher fidelity when working with pulse width modulation signals.

Recall that the rising edge detection signals and the falling edge detection signals are capacitively isolated from the input pulse width modulation signal. This capacitive isolation allows the generation of the output pulse width modulation signal using different power sources than were used to generate the input pulse width modulation signal. Thus, the isolation driver circuit provides isolation allowing for high power driving of the output pulse width modulation signal even though the input pulse width modulation signal is of lower power.

As a mere example, the output pulse width modulation signal may be used to drive one or more power transistors so as to accurately generate an amplified output pulse width modulation signal that is an amplified form of the input pulse width modulation signal. This could occur if, for example, the isolation driver circuit was included in a class D amplifier. In this case, the analog input signal to the class D amplifier would be amplified with high fidelity in the class D amplifier since the pulse widths were highly preserved.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the advantages and features of the circuits, systems, and methods described herein can be obtained, a more particular description of the embodiments briefly described herein will be rendered by reference to specific embodiments thereof which are illustrated in the appended drawings. Understanding that these drawings depict only typical embodiments of the circuits, systems and methods described herein, and are not therefore to be considered to be limiting of their scope, certain circuits, systems and methods will be described and explained with additional specificity and detail through the use of the accompanying drawings in which.

DETAILED DESCRIPTION

Figure 1:
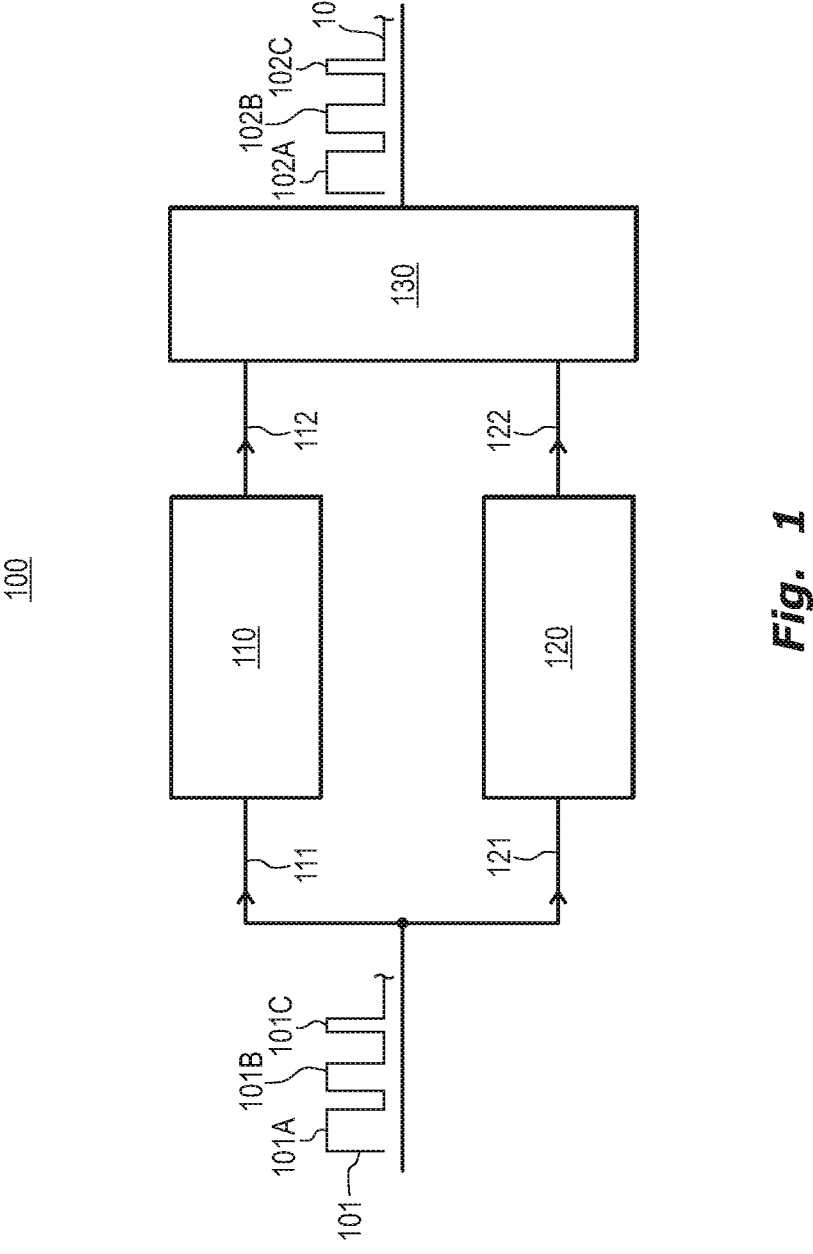
FIG. 1 illustrates an isolation driver circuit in which the principles described herein may be practiced, and is just one example of an isolation driver circuit that is consistent with the principles described herein.

Embodiments described herein relate to an isolation driver circuit for a pulse width modulation signal. The isolation driver circuit is configured to generate a rising edge of an output pulse width modulation signal in response to detecting a rising edge of an input pulse width modulation signal, and to generate a falling edge of the output pulse width modulation signal in response to detecting a falling edge of the input pulse width modulation signal. Moreover, the generation of the rising edge and the falling edge is performed such that the time between the rising edge and the falling edge for the output pulse width modulation signal is closer to the time between the rising edge and the falling edge of the input pulse width modulation signal. In other words, the pulse width of the input pulse width modulation signal is highly accurately preserved in the pulse width of the output pulse width modulation signal. Since information is represented in a pulse width modulation signal using pulse width, this means that the information present within the input pulse width modulation signal is preserved with high fidelity within the output pulse width modulation signal.

The isolation driver circuit includes a rising edge detection circuit, a falling edge detection circuit, and a decoder. The rising edge detection circuit detects rising edges of the input pulse width modulation signal, and outputs corresponding rising edge detection signals that are capacitively isolated from the input pulse width modulation signal. This may be accomplished by using a clock to modulate the input pulse width modulation signal where the clock signal has a rising edge that is coherent with the rising edge of the input pulse width modulation signal.

Likewise, the falling edge detection circuit detects falling edges of the input pulse width modulation signal, and outputs corresponding falling edge detection signals that are capacitively isolated from the input pulse width modulation signal. However, this is accomplished by using a separate clock signal to modulate the input pulse width modulation signal where the separate clock signal has a rising edge that is coherent with the falling edge of the input pulse width modulation signal (whereas the rising edge of the other clock signal has coherence with the rising edge of the input pulse width modulation signal).

As the decoder receives the rising edge detection signals from the rising edge detection circuit, the decoder outputs rising edges of the output pulse width modulation signal. Similarly, as the decoder receives the falling edge detection signals from the falling edge detection circuit, the decoder outputs falling edges of the output pulse width modulation signal. Accordingly, the decoder generates a rising edge in the output signal that temporally aligns with the rising edge of the input signal, and a falling edge in the output signal that temporally aligns with the falling edge of the input signal. This more accurately preserves the pulse width and thus allows information to be conveyed with higher fidelity when working with pulse width modulation signals.

Recall that the rising edge detection signals and the falling edge detection signals are capacitively isolated from the input pulse width modulation signal. This capacitive isolation allows the generation of the output pulse width modulation signal using different power sources than were used to generate the input pulse width modulation signal. Thus, the isolation driver circuit provides isolation allowing for high power driving of the output pulse width modulation signal even though the input pulse width modulation signal is of lower power.

As a mere example, the output pulse width modulation signal may be used to drive one or more power transistors so as to accurately generate an amplified output pulse width modulation signal that is an amplified form of the input pulse width modulation signal. This could occur if, for example, the isolation driver circuit was included in a class D amplifier. In this case, the analog input signal to the class D amplifier would be amplified with high fidelity in the class D amplifier since the pulse widths were highly preserved.

FIG. 1 illustrates an isolation driver circuit 100 in which the principles described herein may be practiced, and is just one example of an isolation driver circuit that is consistent with the principles described herein. The isolation driver circuit 100 processes an input pulse width modulation signal 101 to generate an output pulse width modulation signal 102.

A pulse width modulation signal is a signal in which information is represented in a pulse width. As an example only, the input pulse width modulation signal 101 shows three pulses 101A, 101B and 101C. The pulse width of pulse 101A is rather wide, the pulse width of pulse 101C is rather narrow, and the pulse width of pulse 101B is in between. The width of each of the pulses 101A, 101B and 101C represents information, and thus the information may be extracted based on the value of the pulse widths.

The principles described herein are not limited to what the represented information actually is. However, as an example only, the information could be an analog waveform, where the width of a pulse at any given time corresponds to the magnitude of the analog waveform at that given time. That is, a higher duty cycle of pulse widths could correspond to higher magnitudes of the analog waveform, whereas a lower duty cycle of pulse widths could correspond to lower magnitudes of the analog waveform. Thus, in this case, an analog waveform may be generated from a sequence of pulses based on their pulse widths.

The isolation driver circuit 100 may be used to process the input pulse width modulation signal 101 into the output pulse width modulation signal 102 in such a way that the power supply of the output pulse width modulation signal 102 is isolated from the power supply of the input pulse width modulation signal 101, hence the term "isolation driver circuit". Isolating the power supply of the output pulse width modulation signal 102 from the power supply of the input pulse width modulation signal 101 allows for high power driving of the output pulse width modulation signal 102 even though the input pulse width modulation signal 101 is of low power. Thus, sensitive components contained within the input side of the isolation driver 100 may be protected from substantially higher power present within the output side of the isolation driver 100.

Ideally, the isolation driver circuit 100 ensures that pulse widths in the input pulse width modulation signal 101 are substantially the same as the pulse widths in the output pulse width modulation signal 102. For instance, pulses 102A through 102C of the output pulse width modulation signal 102 correspond to respective pulses 101A through 101C of the input pulse width modulation signal 101. As illustrated, the pulse width of pulse 102A is about the same as the pulse width of pulse 101A, the pulse width of pulse 102B is about the same as the pulse width of pulse 101B, and the pulse width of pulse 102C is about the same as the pulse width of pulse 101C. Thus, the information represented by the pulse widths in the input pulse width modulation signal 101 is also represented in the output pulse width modulation signal 102. Of course, perfect matching of output pulse widths to input pulse widths is a practical impossibility. However, in accordance with the principles described herein, the output pulse widths closely match the input pulse widths.

In accordance with the principles described herein, this is accomplished by closely temporally aligning the rising edges and falling edges of the input pulse width modulation signal 101 with the respective rising edges and falling edges of the output pulse width modulation signal 102. To do this, the isolation driver circuit 100 generates a rising edge of the output pulse width modulation signal 102 in response to detecting a rising edge of the input pulse width modulation signal 101, and generates a falling edge of the output pulse width modulation signal 102 in response to detecting a falling edge of the input pulse with modulation signal 101.

The generation of the rising edge and the falling edge is performed such that the amount of time between the rising edge and the falling edge for the output pulse width modulation signal 102 is substantially close to the amount of time between the rising edge and the falling edge for the input pulse width modulation signal 101. As an example, the isolation driver circuit 100 will generate the rising edge of the pulse 102A of the output pulse width modulation signal 102 in response to detecting the rising edge of the pulse 101A of the input pulse width modulation signal 101. Further, the isolation driver circuit 100 will generate the falling edge of the pulse 102A of the output pulse width modulation signal 102 in response to detecting the falling edge of the pulse 101A of the input pulse width modulation signal 101. Importantly, this is done so that the amount of time between the rising edge and the falling edge of the pulse 102A is very close to the amount of time between the rising edge and the falling edge of the pulse 101A.

The same could be done for any corresponding pulse of the input pulse width modulation signal 101 and output pulse width modulation signal 102 to align appropriate rising and falling edges. Accordingly, the pulse widths of the input pulse width modulation signal 101 are highly accurately preserved in the pulse widths of the output pulse width modulation signal 102. Thus, information represented in the pulse widths of the input pulse width modulation signal 101 is preserved with high fidelity within the output pulse width modulation signal 102.

To perform the processing of the input pulse width modulation signal 101 into the output pulse width modulation signal 102, the isolation driver circuit 100 includes a rising edge detection circuit 110, a falling edge detection circuit 120, and a decoder 130. As represented by arrowed line 111, the rising edge detection circuit 110 detects rising edges of the input pulse width modulation signal 101. In response, as represented by arrowed line 112, the rising edge detection circuit 110 outputs corresponding rising edge detection signals to the decoder 130. This may be accomplished by using a clock to modulate the input pulse width modulation signal 101 where the clock signal has a rising edge that is coherent with the rising edge of the input pulse width modulation signal 101.

In the description and in the claims, an edge of a signal is said to be "coherent" with an edge of a second signal if the edge of the first signal is caused to be at approximately the same time as the edge of the second signal. Thus, the rising edges of a first signal and a second signal are coherent if they are caused to occur at approximately the same time.

As the isolation driver circuit 100 performs isolation, the power supply of the rising edge detection signals is capacitively isolated from the power supply of the input pulse width modulation signal 101. This means also that the power supply of the output pulse width modulation signal 102 is isolated from the power supply of the input pulse width modulation signal 101, thus effectuating the function of isolation in the isolation driver circuit 100.

On the other hand, as represented by arrowed line 121, the falling edge detection circuit 120 detects falling edges of the input pulse width modulation signal 101. In response, as represented by arrowed line 122, the falling edge detection circuit 120 outputs corresponding falling edge detection signals to the decoder 130. This may be accomplished by using a separate clock signal to modulate an inverse of the input pulse width modulation signal 101 where the separate clock signal has a rising edge that is coherent with the falling edge of the input pulse width modulation signal 101 (and is therefore coherent with the rising edge of the inverse of the input pulse width modulation signal 101). This contrasts with the clock signal used by the rising edge detection circuit 110, which has a rising edge that is coherent with the rising edge of the input pulse width modulation signal 101.

Again, as the isolation driver circuit 100 performs isolation, the power supply of the falling edge detection signals is capacitively isolated from the power supply of the input pulse width modulation signal 101. This means also that the power supply of the output pulse width modulation signal 102 is isolated from the power supply of the input pulse width modulation signal 101, thus effectuating the function of isolation in the isolation driver circuit 100.

As the decoder 130 receives the rising edge detection signal from the rising edge detection circuit 110, the decoder 130 outputs rising edges of the output pulse width modulation signal 102. Likewise, as the decoder 130 receives the falling edge detection signals from the falling edge detection circuit 120, the decoder 130 outputs falling edges of the output pulse width modulation signal 102. Accordingly, the decoder 130 generates a rising edge in the output pulse width modulation signal 102 that temporally aligns with the rising edge of the input pulse width modulation signal 101, and a falling edge in the output pulse width modulation signal 102 that temporally aligns with the falling edge of the input pulse width modulation signal 101.

Since the rising edges and the falling edges in the output pulse width modulation signal 102 are substantially temporally aligned with the respective rising edges and the falling edges in the input pulse width modulation signal 101, the pulse widths of the input pulse width modulation signal 101 are substantially preserved in the output pulse width modulation signal 102. Thus, the information stored in those pulse widths may be conveyed with higher fidelity.

As a mere example, the output pulse width modulation signal may be used to drive one or more power transistors so as to accurately generate an amplified output pulse width modulation signal that is an amplified form of the input pulse width modulation signal. This could occur if, for example, the isolation driver circuit was included in a class D amplifier. In this case, the analog input signal to the class D amplifier would be amplified with high fidelity in the class D amplifier since the pulse widths were highly preserved.

Figure 2:
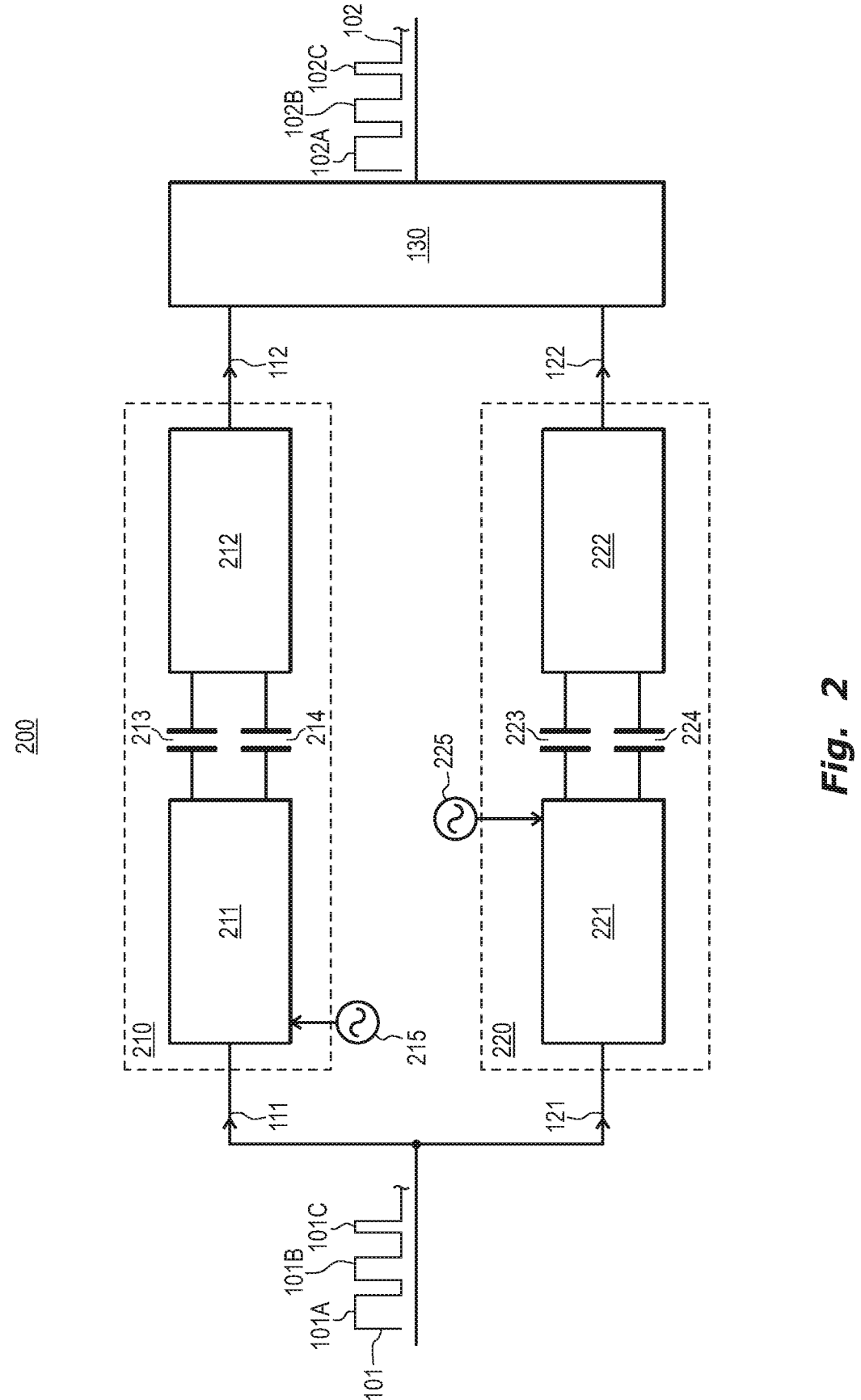
FIG. 2 illustrates an isolation driver circuit, which is an example of the isolation driver circuit of FIG. 1.

FIG. 2 illustrates an isolation driver circuit 200, which is an example of the isolation driver circuit 100 of FIG. 1. The isolation driver circuit 200 includes a rising edge detection circuit 210 and a falling edge detection circuit 220, which are respective examples of the rising edge detection circuit 110 and the falling edge detection circuit 120 of FIG. 1.

The rising edge detection circuit 210 includes a modulator 211, a demodulator 212, and capacitors 213 and 214. Likewise, the falling edge detection circuit 220 includes a modulator 221, a demodulator 222, and capacitors 223 and 224. The modulator 211 of the rising edge detection circuit 210 modulates the input pulse width modulation signal 101 using a clock signal from a clock 215, whereas the modulator 221 of the falling edge detection circuit 220 modulates the input pulse width modulation signal 101 using a different clock signal from a clock 225.

As previously expressed, an isolation driver circuit (e.g., the isolation driver circuit 200 of FIG. 2) may use isolative means (e.g., the capacitors 213, 214, 223 and 224 of FIG. 2) to isolate the low power of an input signal from the high power of an output signal. In order to pass an input signal through, for example, the capacitors 213, 214, 223 and 224, that input signal is first turned into an AC signal of sufficiently high frequency to pass the capacitors. This may be accomplished using, for example, the modulators 211 and 221.

For example, when an input signal is high, the modulator 211 may use a clock signal from the clock 215 to output an oscillating signal by modulating the input signal with the clock signal, whereas when the input signal is low, the modulator stops outputting the oscillating signal (since modulation with no signal still results in no signal). In contrast, when the input signal is low, the modulator 221 may use a clock signal from the clock 225 to output an oscillating signal by modulating an inverse of the input signal with the clock signal, whereas when the input signal is high, the modulator stops outputting the oscillating signal (because the inverse of the input signal is low).

Figure 3:
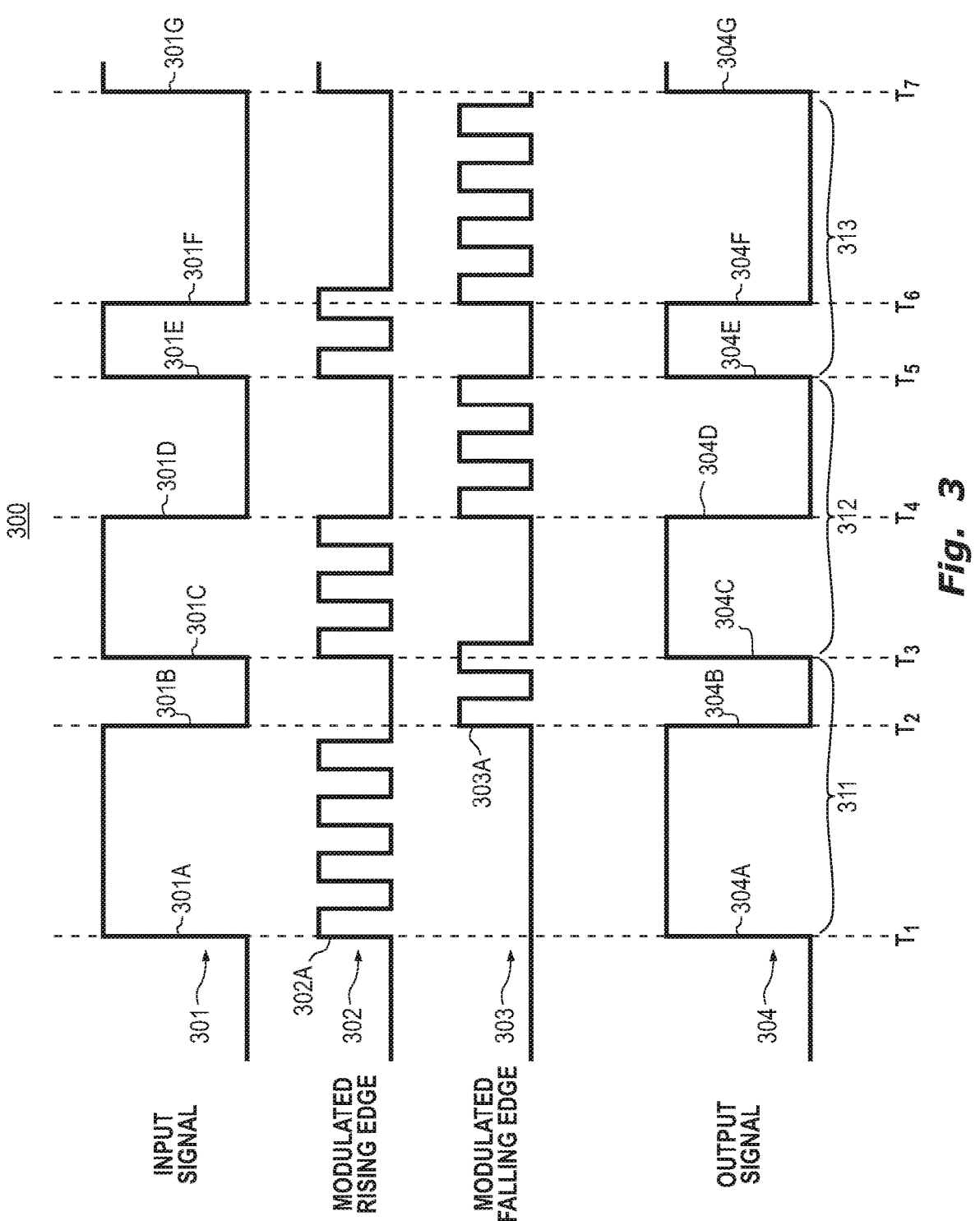
FIG. 3 illustrates a signal diagrams chart, which shows an input signal prior to modulation, a first modulated signal, a second modulated signal, and an output signal that represents the input signal and that is generated by using the first modulated signal and the second modulated signal.

FIG. 3 illustrates a signal diagrams chart 300, which shows an input signal 301 prior to modulation, a first modulated signal 302 and a second modulated signal 303, and an output signal 304. The output signal 304 is decoded from demodulated forms of the first modulated signal 302 and the second modulated signal 303. The horizontal axis represents time passing from left to right, where the same horizontal position in each of the four signals 301 through

304 represents the same time of the respective signal. For instance, time $T_1$ through time $T_7$ are specifically marked with vertical dashed lines extending through all of the four signals 301 through 304. The time is divided into three time periods 311, 312 and 313. Each time period includes a pulse cycle in which the pulse width conveys information.

Signal 301 represents an input signal, which is an example of the input pulse width modulation signal 101 shown in FIG. 1 and FIG. 2. Accordingly, recall that information is conveyed in the pulse width of each pulse cycle. In this example, the duty cycle of the input signal 301 in the first time period 311 is approximately 75 percent, the duty cycle of the input signal 301 in the second time period 312 is approximately 50 percent, and the duty cycle of the input signal 301 in the third time period 313 is approximately 25 percent.

Signal 302 represents a first modulated signal 302 that represents the input signal 301 as modulated using a clock signal from the clock 215 of FIG. 2. Specifically, the clock signal is coherent with the rising edge of the input signal 301. Accordingly, the first modulated signal 302 may also be referred to as the modulated rising edge signal 302. A rising edge is detectable by detecting a rising edge of the first pulse in a sequence of pulses of the modulated rising edge signal 302 (for each time period). This rising edge of the sequence of pulses will be present as a rising edge in the demodulated form of the modulated rising edge signal 302. That rising edge of the demodulated signal may thus be a rising edge detection signal.

For instance, a rising edge in a first pulse in a sequence of pulses that occurs in the first time period 311 occurs at time $T_1$. Accordingly, the rising edge in the demodulated signal also occurs substantially at time $T_1$. Furthermore, a rising edge of a first pulse in a sequence of pulses that occurs in the second time period 312 (and thus also the rising edge of the demodulated signal) occurs at time $T_3$. Finally, a rising edge of a first pulse in a sequence of pulses that occurs in the third time period 313 (and thus also the rising edge of the demodulated signal) occurs at time $T_5$.

Signal 303 represents a second modulated signal 303 that represents an inverted form of the input signal 301 as modulated using a clock signal from the clock 225 of FIG. 2. Specifically, the clock signal is coherent with the falling edge of the input signal 301. Accordingly, the second modulated signal 303 may also be referred to as the modulated falling edge signal 303. A falling edge is detectable by detecting a rising edge of the first pulse in a sequence of pulses of the modulated falling edge signal 303 (for each time period). For instance, a rising edge in a first pulse in a sequence of pulses (of the modulated falling edge signal 303) that occurs in the first time period 311 (and thus also the rising edge of the demodulated signal) occurs at time $T_2$. A rising edge of a first pulse in a sequence of pulses (of the modulated falling edge signal 303) that occurs in the second time period 312 (and thus also the rising edge of the demodulated signal) occurs at time $T_4$. Finally, a rising edge of a first pulse in a sequence of pulses (of the modulated falling edge signal 303) that occurs in the third time period 313 (and thus also the rising edge of the demodulated signal) occurs at time $T_6$.

Signal 304 represents an output signal, which is an example of the output pulse width modulation signal 102 of FIG. 1 and FIG. 2, as outputted by the decoder 130 upon receiving rising edge detection signals from the demodulator 212 and falling edge detection signals from the demodulator 222. For instance, the rising edges were detected as occurring at times $T_1$, $T_3$ and $T_5$, whereas the falling edges were detected as occurring at times $T_2$, $T_4$ and $T_6$.

This description will now walk through a description of what occurs at each time $T_1$ through $T_7$ in the example of FIG. 3. At time $T_1$, in the first period 311, the input signal 301 has a rising edge 301A in which the input signal 301 switches from a low voltage (e.g., zero volts) to a high voltage (e.g., five volts). In response to this transition high, to ensure coherency with the rising edge 301A, the clock 215 begins by generating a clock signal (not shown) having a rising edge very shortly after rising edge 301A of the input signal 301. Furthermore, because the modulator 211 is driven by the clock 215 to modulate the input signal 301 to generate the modulated rising edge signal 302, the modulated rising edge signal 302 also has a rising edge 302A that occurs very shortly after the rising edge 301A of the input signal 301. In fact, this response is so fast, that the rising edge 302A of the modulated rising edge signal 302 appears in FIG. 3 to be occurring at substantially the same time (at time $T_1$) as the rising edge 301A of the input signal 301.

Referring briefly to FIG. 2, the demodulator 212 receives the modulated rising edge signal 302 via the capacitor 213. The demodulator 212 demodulates the modulated rising edge signal 302, and thus will output a transition high in response to receiving the first rising edge 302A in a sequence of pulses in the modulated rising edge signal 302 that occurs in the first time period 311. This rising edge detection signal may simply be this rising edge of the demodulated signal output by the demodulator 212. In response to this, the decoder 130 generates a rising edge 304A in the output signal 304. Again, this occurs so quickly that in FIG. 3, the rising edge 304A is shown as occurring at substantially the same time $T_1$ as the rising edge 302A of the modulated rising edge signal 302, and as the rising edge 301A of the input signal 301.

Between times $T_1$ and $T_2$, the input signal 301 remains at the high voltage. Accordingly, the modulator 211 continues to generate pulses in the modulated rising edge signal 302. In FIG. 3, for instance, there are four pulses within the modulated rising edge signal 302 that occur in the time period 311. Note that there are no pulses within the modulated falling edge signal 301 between time $T_1$ and $T_2$ because the modulated falling edge signal 303 is modulated using the inverse of the input signal 301. And since the input signal 301 is high between times $T_1$ and $T_2$, the inverse of the input signal 301 is low between times $T_1$ and $T_2$.

At time $T_2$ in the first time period 311, the input signal 301 has a falling edge 301B in which the input signal 301 switches from the high voltage to the low voltage. In response to this transition low, to ensure coherency with the falling edge 301B, the clock 225 begins by generating a clock signal with a rising edge very shortly after the falling edge 301B of the input signal 301. Furthermore, because the modulator 221 is driven by the clock 225 to modulate the input signal 301 to generate the modulated falling edge signal 303, the modulated falling edge signal 303 also has a rising edge 303A that occurs very shortly after the falling edge 301B of the input signal 301. Again, this response is so fast, that the rising edge 303A of the modulated falling edge signal 303 appears in FIG. 3 to be occurring at substantially the same time (at time $T_2$) as the falling edge 301B of the input signal 301.

Referring again to FIG. 2, the demodulator 222 receives the modulated falling edge signal 303 via the capacitor 223. The demodulator 222 demodulates the modulated falling edge signal 303, and thus will output a transition high in response to receiving the first rising edge 303A in a sequence of pulses in the modulated falling edge signal 303 that occurs in the first time period 311. The falling edge detection signal may simply be this rising edge of the demodulated signal output by the demodulator 222. In response to this, the decoder 130 generates a falling edge 304B in the output signal 304. Again, this occurs so quickly that in FIG. 3, the falling edge 304B is shown as occurring at substantially the same time $T_2$ as the rising edge 303A of the modulated falling edge signal 303, and as the falling edge 301B of the input signal 301.

Between times $T_2$ and $T_3$, the input signal 301 remains at the low voltage. Accordingly, the modulator 221 continues to generate pulses in the modulated falling edge signal 303. In FIG. 3, for example, there are two pulses that at least partially occur in the modulated falling edge signal 303 during time period 311. Note that the modulator 211 has stopped generating pulses in the modulated rising edge signal 302 between time $T_2$ and $T_3$ because the modulated rising edge signal 302 is modulated using the input signal 301, and not the inverse of the input signal 301.

This process of generating rising edges (e.g., rising edges 304C, 304E and 304G) and falling edges (e.g., falling edges 304D and 304F) in the output signal 304 based on the rising edges (e.g., rising edges 301C, 301E and 301G) and falling edges (e.g., falling edges 301D and 301F) in the input signal 301 via the respective modulated rising edge detection signal 302 and modulated falling edge detection signal 303 repeats for the remaining time periods 312 and 313. That is, a rising edge 304C is generated at time $T_3$ based on the rising edge of the first pulse in the sequence of pulses of the modulated rising edge signal 302 in the second time period 312 occurring at time $T_3$. Thereafter, a falling edge 304D is generated at time $T_4$ based on the rising edge of the first pulse in the sequence of pulses of the modulated falling edge signal 303 in the second time period 312 occurring at time $T_4$. Subsequently, a rising edge 304E is generated at time $T_5$ based on the rising edge of the first pulse in the sequence of pulses of the modulated rising edge signal 302 in the third time period 313 occurring at time $T_5$. Thereafter, a falling edge 304F is generated at time $T_6$ based on the rising edge of the first pulse in the sequence of pulses of the modulated falling edge signal 303 in the third time period 313 occurring at time $T_6$. This may continue indefinitely as represented by edges 301G of the input signal 301 and edge 304G of the output signal 304.

During transmission of the modulated rising edge signal 302 via the capacitor 213 and the modulated falling edge signal 303 via the capacitor 223, corresponding common mode signals may be transmitted over the capacitors 214 and 224. As an example, as the modulated rising edge signal 302 is transmitted over the capacitor 213, the common mode signal transmitted over the capacitor 214 may be an inverted form of the modulated rising edge signal 302. Likewise, as the modulated falling edge signal 303 is transmitted over the capacitor 223, the common mode signal transmitted over the capacitor 224 may be an inverted form of the modulated falling edge signal 303. Accordingly, signals transmitted via capacitors 213 and 214 may together represent a differential pair of signals. Furthermore, signals transmitted via capacitors 223 and 224 may together represent a differential pair of signals. These common mode signals may be used by the demodulators 212 and 222 to cancel out unwanted noise that may occur in the respective modulated rising edge signal 302 and modulated falling edge signal 303, and thus the demodulators 212 and 222 may more accurately generate the respective rising edge detection signals and falling edge detection signals.

Further, there will always be some delay between the time that an edge is detected in the input signal 301 and the time that the corresponding edge is generated in the output signal 304. However, this delay may be negligible compared to the period of a pulse cycle since the isolation driver circuit 100 is a solid-state device. However, even if the delay was substantial, so long as the delay is relatively constant from edge to edge, the pulse widths in the output signal 304 will still match closely the pulse widths in the input signal 301. Thus, information is preserved even if there was a delay, so long as the delay is relatively constant.

Furthermore, for any given time period, it is really only the rising edge of the first pulse in the respective sequence of pulses of the modulated rising edge signal 302 that is used to detect the rising edge of the input signal 301 for that pulse cycle (since that is the rising edge that results in a rising edge in the demodulated signal). Similarly, it is really only the rising edge of the first pulse in the respective sequence of pulses of the modulated falling edge signal 303 that is used to detect the falling edge of the input signal 301 for that pulse cycle (since that is the rising edge that results in a rising edge in the demodulated signal). The remaining pulses of that time period of the modulated rising edge signal 302 and modulated falling edge signal 303 are superfluous. But as for implementation, it is much harder to just generate a single pulse than it is to simply allow the modulation to continue through to the next edge. Accordingly, there is no harm in generating these superfluous pulses. Additionally, the pulse widths between rising edges and falling edges in the input signal 301 are substantially preserved in the pulse widths between rising edges and falling edges in the output signal 303, regardless of the frequencies of the clock signals provided by the clocks 215 and 225.

In accordance with the principles described herein, the output signal is derived by using two different modulation signals, one (a modulated rising edge signal) for detecting the rising edge of the input signal, and one (a modulated falling edge signal) for detecting the falling edge of the input signal. Furthermore, high accuracy temporal alignment of the edges is accomplished by having the clock that drives the modulation of the modulated rising edge signal be coherent with the rising edge of the input signal, and by having another clock that drives the modulation of the modulated falling edge signal be coherent with the falling edge of the input signal. Thus, the demodulated form of the modulated rising edge signal will have a rising edge that aligns with the rising edge of the input pulse width modulation signal, and thus is treated as a rising edge detection signal. Furthermore, the demodulated form of the modulated falling edge signal will have a rising edge that aligns with the falling edge of the input pulse width modulation signal, and thus is treated as a falling edge detection signal. By treating the respective rising edges as detection signals, pulse widths are preserved to a greater extent than by using a single clock signal and a single modulated signal, where the clock is not coherent with the input signal. The reason for this will become clear from the following description of FIG. 4.

Figure 4:
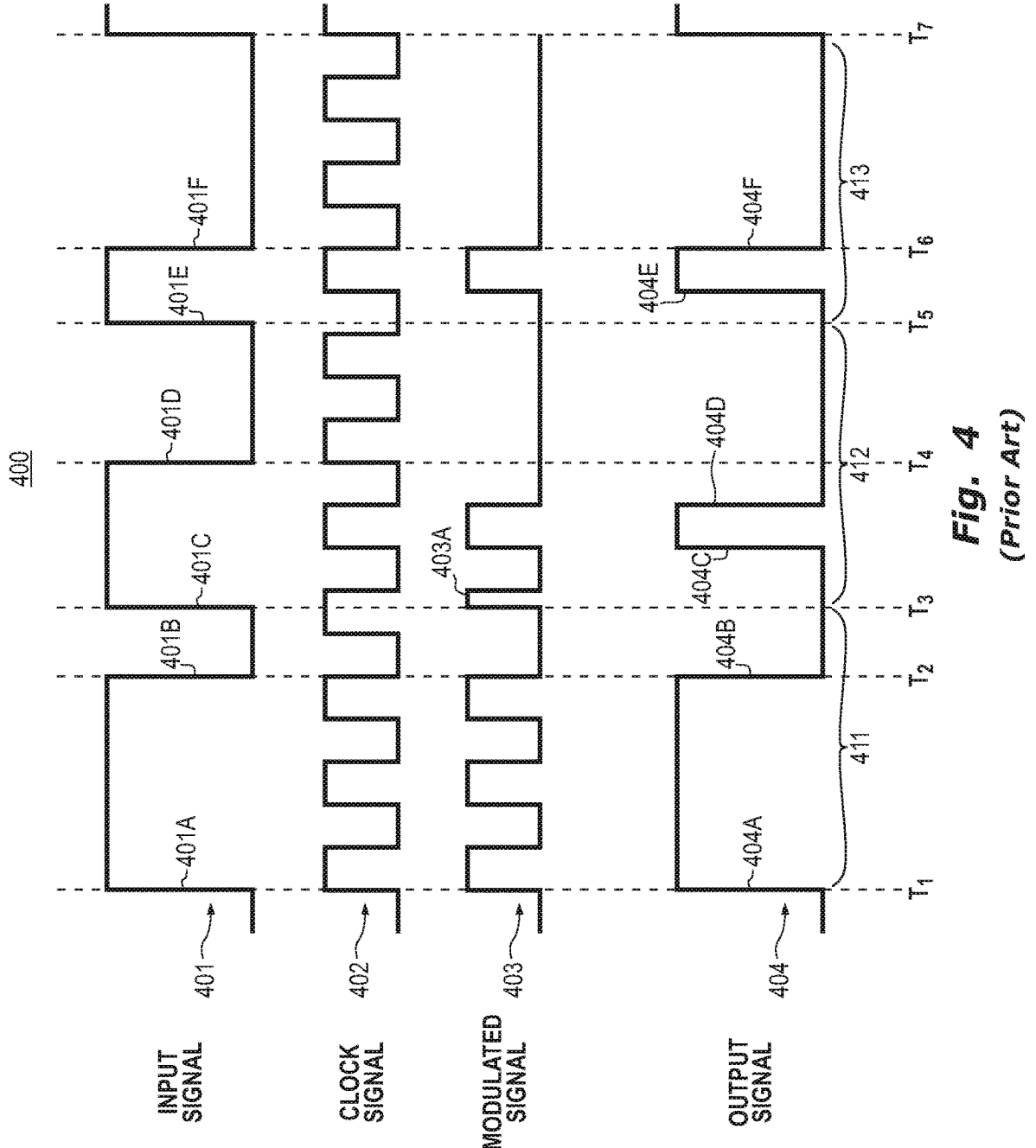
FIG. 4 illustrates a signal diagrams chart, which shows an example of signals involved in the modulation of an input signal to generate an output signal, according to the prior art, in which only one clock signal and one modulator are used.

FIG. 4 illustrates a signal diagrams chart 400, which shows an example of signals involved in the modulation of an input signal to generate an output signal, according to prior art, in which only one clock signal and one modulator are used. Four signals 401, 402, 403 and 404 are illustrated. The horizontal axis represents time passing from left to right, where the same horizontal position in each of the four signals 401 through 404 represents the same time of the respective signal. For instance, time $T_1$ through time $T_7$ are specifically marked. The time is divided into three time periods 411, 412 and 413.

Signal 401 represents an input signal, which for comparison purposes is similar to the input signal 301 of FIG. 3. Signal 402 represents a clock signal which is not coherent with the input signal 401, though there may be times where edges of the signals 401 and 402 do align by coincidence. Signal 403 represents a modulated signal in which the input signal is modulated with the clock signal 402. Signal 404 represents an output signal having been demodulated from the modulated signal 403. In general, periods of time in which the modulated signal 403 has pulses are demodulated to be a high state in the output signal 404, and periods of time in which there are not such pulses are demodulated to be a low state in the output signal 404.

By using only one modulator that uses only one clock signal, rising and falling edges of the clock signal may not temporally align with rising edges and falling edges of an input signal. For instance, in this particular example, edges 401A, 401B and 401F of the input signal 401 do align with respective edges 404A, 404B and 404F of the output signal 404. However, edges 404C, 404D and 404E do not align well with respective edges 401C, 401D and 401E. Thus, the output signal 404 demodulated from the modulated signal 403 has inconsistencies in pulse widths compared to the input signal 401. This results in loss of information and jitter.

For instance, in the first time period 411, by happenstance, the rising edge 401A and falling edge 401B of the input signal 401 and the rising edge 404A and the falling edge 404B of the output signal 404 do align. However, this is only because of the fortunate situation in which the rising edge 401A of the input signal 401 happens to align with a rising edge of the clock signal 402, and the falling edge 401B of the input signal 401 happens to align with a falling edge of the clock signal 402. This good fortune cannot continue when the clock signal 402 and the input signal 401 are not coherent.

For example, at time $T_3$, the clock signal 402 is already high, and thus does not have a rising edge that substantially aligns with the rising edge 401C of the input signal 401. Accordingly, the modulated signal 403 may have a very narrow pulse 403A, which may not be properly detected by a demodulator, and thus the demodulator may not output a rising edge 404C in the output signal 404 until the next rising edge of the clock signal 402. Furthermore, the last pulse in the second time period 412 within the modulated signal 403 occurs well before time $T_4$, and thus, the demodulated pulse of the second time period 412 has a falling edge 404D that occurs well before time $T_4$.

Likewise, at time $T_5$, the clock signal 402 is low, and thus does not have a rising edge that substantially aligns with the rising edge 401E of the input signal 401. Thus, the modulated signal 403 may not begin generating a pulse until the next rising edge of the clock signal 402, and the demodulator may not output a rising edge 404E in the output signal 404 until the next rising edge of the clock signal 402. However, again by good luck, the falling edge 401F of the input signal 401 does align with a falling edge of the clock signal 402, and thus the falling edge 404F of the output signal 404 does align with the falling edge 401F of the input signal 401.

FIG. 4 demonstrates that there are inaccuracies between the pulse width of an output pulse width modulated signal as compared to an input pulse width modulated signal when modulating using a single clock signal that is not coherent with the input signal. The inaccuracies may be reduced by a higher frequency clock (with shorter periods between clock pulses). However, inaccuracies in pulse widths would still be present, but on the order of the period of the clock signal. In accordance with the principles described herein, the pulse width accuracy is more precise and does not depend on the frequency of the clock signal.

Referring back to FIG. 2 and FIG. 3, recall that, to ensure coherency with the rising edge 301A of the input signal 301, the clock 215 begins by generating a clock signal that has a rising edge very shortly after the rising edge 301A of the input signal 301. Similarly, to ensure coherency with the falling edge 301B of the input signal 301, the clock 225 begins by generating a clock signal that has a rising edge very shortly after the falling edge 301B of the input signal 301. In order to begin generating such clock signals very shortly after the rising edge 301A or the falling edge 301B of the input signal, a quick startup clock may be used, as is the case in FIG. 5.

Figure 5:
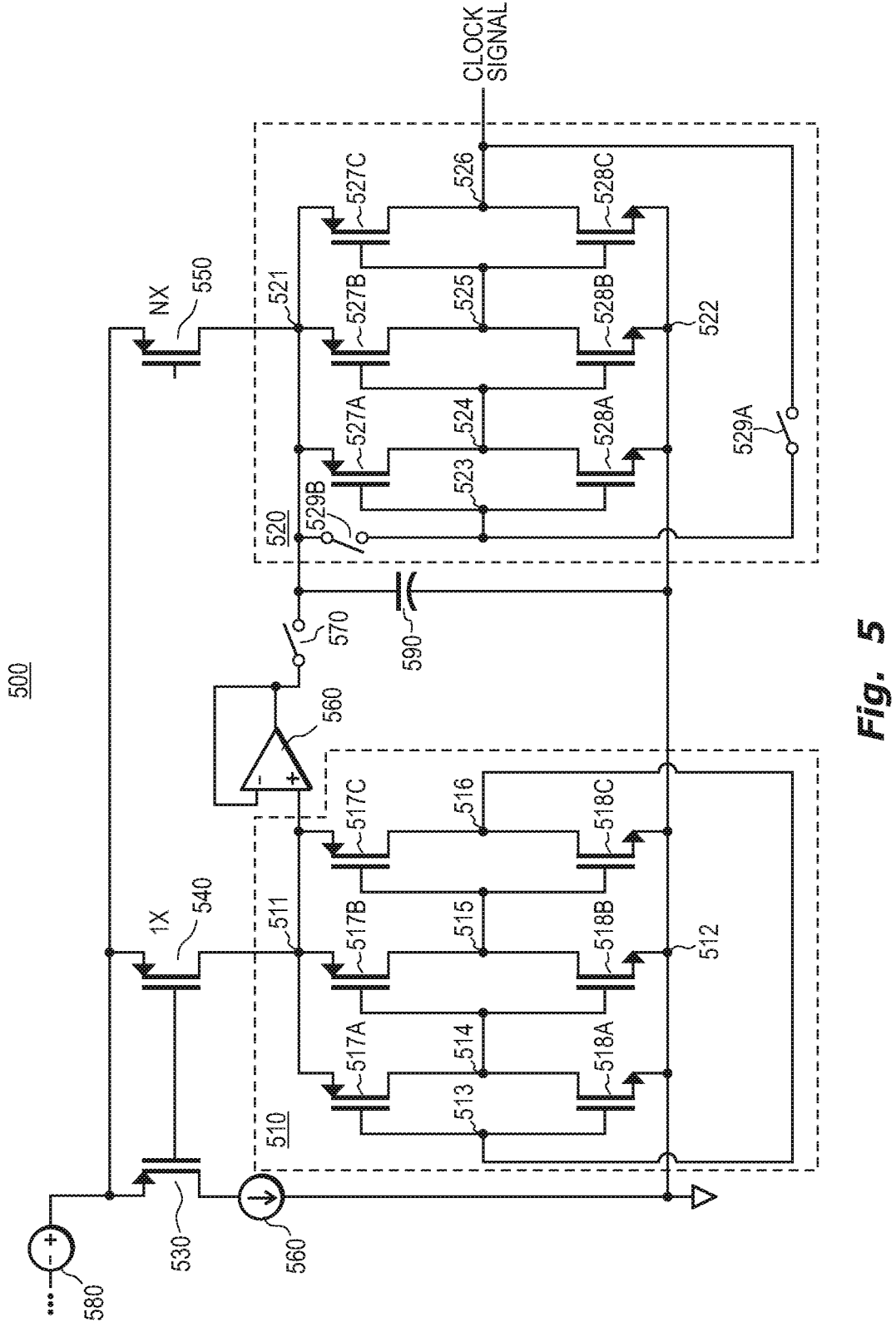
FIG. 5 illustrates a quick startup clock, which is an example of each of the clocks of FIG. 2.

FIG. 5 illustrates a quick startup clock 500, which is an example of each of the clock 215 and the clock 225 of FIG. 2. The quick startup clock 500 includes an auxiliary oscillator 510 and a main oscillator 520. The auxiliary oscillator 510 is a low power oscillator that stays on, assuming power is supplied to the quick startup clock 500. On the other hand, the main oscillator 520 is a high power oscillator that provides the actual clock signal to a modulator (e.g., the modulator 211 or 221 of FIG. 2). The main oscillator 520 is only on when the input pulse width modulation signal (e.g., input pulse width modulation signal 101 of FIG. 1 and FIG. 2, or input signal 301 of FIG. 3) is high, in the case of the quick startup clock 500 operating as the clock 215 of FIG. 2. Of course, if the quick startup clock 500 was operating as the clock 225 of FIG. 2, the main oscillator 520 would instead only be on when the inverse of the input pulse width modulation signal is high, and thus when the input pulse width modulation signal is low.

A high power oscillator, such as the main oscillator 520, by itself may require significant start up time whenever the input pulse width modulation signal goes high (or when the inverse of the input pulse width modulation signal goes high). Such significant startup time may cause significant delay between an edge in the input pulse width modulation signal and an initial rising edge in the clock signal, and thus coherency between the rising edge or the falling edge in the input signal and the rising edge in the clock signal may not be ensured. Accordingly, the quick startup clock 500 overcomes this significant start up delay by using the auxiliary oscillator 510, which is already running, to quickly start up the main oscillator 520 when the input pulse width modulation signal (or the inverse of the input pulse width modulation signal) goes high. Thus, the quick startup clock 500 is capable of providing a clock signal that has an initial rising edge that is substantially coherent with a rising edge (or a falling edge) of the input pulse width modulation signal.

Some additional structure of the quick startup clock 500 will now be described prior to discussing the operation of the quick startup clock 500. The quick startup clock 500 further includes transistors 530, 540 and 550, and a current source 560, which collectively act as a current mirror. As an example, transistors 530 and 540 may have approximately the same gate width, whereas the transistor 550 may have a gate width that is N times greater than the gate width of the transistors 530 and 540 (where N is much greater than one). Accordingly, the transistors 530 and 540 may have an internal resistance that is N times larger than an internal resistance of the transistor 550.

The auxiliary oscillator 510 includes a local supply node 511, a grounded node 512, intermediate nodes 513 through 516, p-type transistors 517A through 517C, and n-type transistors 518A through 518C. Likewise, the main oscillator 520 includes a local supply node 521, a grounded node 522, intermediate nodes 523 through 526, p-type transistors 527A through 527C, and n-type transistors 528A through 528C. The local supply node 511 of the auxiliary oscillator 510 and the local supply node 521 of the main oscillator 520 are coupled together via an operational amplifier 560 and a switch 570.

Each of the transistors 530, 540 and 550 may be p-type transistors that have source nodes that are each connected to a voltage source 580 that provides a source voltage. The drain node of the transistor 540 is connected to the local supply node 511 of the auxiliary oscillator 510. Accordingly, the local supply node 511 receives charge from the voltage source 580 via the transistor 540, and provides an auxiliary local supply voltage thereon, which is a fraction of the source voltage from the voltage source 580. Similarly, the drain node of the transistor 550 is connected to the local supply node 521 of the main oscillator 520. Accordingly, the local supply node 511 receives charge from the voltage source 580 via the transistor 550, and provides a main local supply voltage thereon, which is a fraction of the source voltage from the voltage source 580. Further, when the switch 570 is closed, while the switches 529A and 529B are opened, the operational amplifier 560 may allow the main local supply voltage present on the local supply node 521 of the main oscillator 520 to be brought close to the auxiliary local supply voltage present on the local voltage supply node 511 of the auxiliary oscillator 510.

In operation, regarding the auxiliary oscillator 510, when provided with power, the transistors 517A through 517C and 518A through 518C alternate between being on and off. More specifically, when intermediate node 513 is provided with a high voltage, the intermediate node 514 is low, the intermediate node 515 is high, and the intermediate node 516 is low. Thus, the application of a high voltage on the node 513, will (with some delay) cause the application of a low voltage on the node 513. On the other hand, when the intermediate node 513 is low, the intermediate node 514 is high, the intermediate node 515 is low, and the intermediate node 516 is high. Thus, the delay in propagating alternating states through the transistors results in clock signal being generated on node 516 (where the frequency is inversely proportional to that delay).

The main oscillator 520 works in a similar fashion. However, if the main oscillator 520 is functioning as the clock 215 of FIG. 2, the switch 529A will close (and the switches 570 and 529B will open) upon detection the rising edge in the input pulse width modulation signal 101. The capacitor 590 also was charged to the proper high voltage and thus the intermediate node 523 is already high, resulting in immediate generation of the clock signal high. Thus, when the input pulse width modulation signal 101 transitions high, the clock 215 quickly generates a rising edge in a clock signal. On the hand, when the input pulse width modulation signal goes low, the switch 570 resulting in recharging of the capacitor 590, so that power is immediately available upon the next transition high of the input pulse width modulation signal. Furthermore, switch 529B is closed so as to force application of a high voltage at node 523, and thereby force a low clock value at node 526. Thus, when the input pulse width modulation signal 101 is low, the clock 215 does not operate.

The main oscillator 520 may also operation as the clock 225 of FIG. 5. The operation would be the same, except that the switch 529A would close, and switches 570 and 529B would open upon the falling edge of the input pulse width modulation signal. Furthermore, the switch 529A would open, and switches 570 and 529B would close upon the rising edge of the input pulse width modulation signal.

Figure 6:
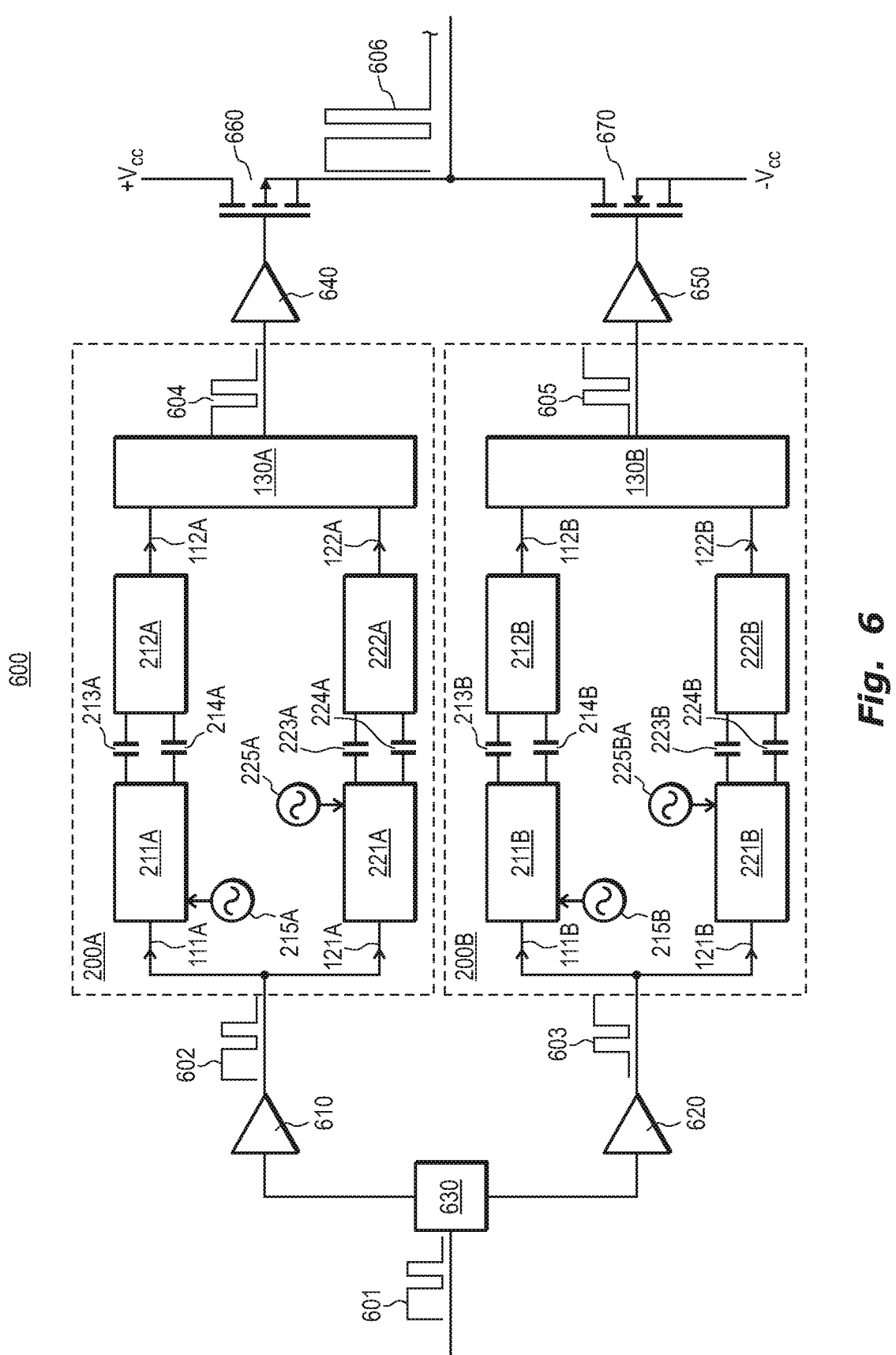
FIG. 6 illustrates an isolation driver circuit, in accordance with the principles described herein, including multiple instances of the isolation driver circuit of FIG. 2.

FIG. 6 illustrates an isolation driver circuit 600, in accordance with the principles described herein. The isolation driver circuit includes two instances 200A and 200B of the isolation driver circuit 200 of FIG. 2. Further, the isolation driver circuit 600 includes a buffer 610, an inverter 620, a deadtime circuit 630, drivers 640 and 650, and transistors 660 and 670. One instance of the isolation driver circuit 200 is labelled as isolation driver circuit 200A, and the other instance of the isolation driver circuit 200 is labelled as isolation driver circuit 200B. The elements of the isolation driver circuit 200A of FIG. 6 are labelled as the same as the elements of the isolation driver circuit 200 of FIG. 2, but with the addition of the suffix "A". Furthermore, the elements of the isolation driver circuit 200B of FIG. 6 are labelled the same as the elements of the secondary side circuit 200 of FIG. 2, but with the addition of the suffix "B".

The buffer 610 generates an input pulse width modulation signal 602 that is a buffered form of the input pulse width modulation signal 601. The deadtime circuit 630 and the inverter 620 together operate such that the inverter 620 generates a complementary input pulse width modulation signal 603 that is complementary with the input pulse width modulation signal 602 but with some deadtime such that the input pulse width modulation signal 602 and the complementary input pulse width modulation signal 603 are not high at the same time. The isolation driver circuit 200A operates on the input pulse width modulation signal 602 in the manner described above for the isolation driver circuit 20 operating on the input pulse width modulation signal 101. Likewise, the isolation driver circuit 200B operates on the complementary input pulse width modulation signal 603 in the manner described above for the isolation driver circuit 200A operating on the input pulse width modulation signal 101.

Furthermore, the output pulse width modulation signal 604 is provided to a driver 640 that responds by driving the gate terminal of the field-effect transistor 660. Similarly, the complementary output pulse width modulation signal 605 is provided to a driver 650 that responds by driving the gate terminal of the field-effect transistor 670. Because of the deadtime introduced by the deadtime circuit 60, the driver signals from the drivers 640 and 650 do not turn on the transistors 660 on at the same time, thus avoiding shoot through of high currents from the high voltage supply +Vcc to the low voltage supply −Vcc. The resulting output signal 606 is an amplified high power pulse width modulation signal that is an amplified form of the input pulse width modulation signal 601.

Figure 7:
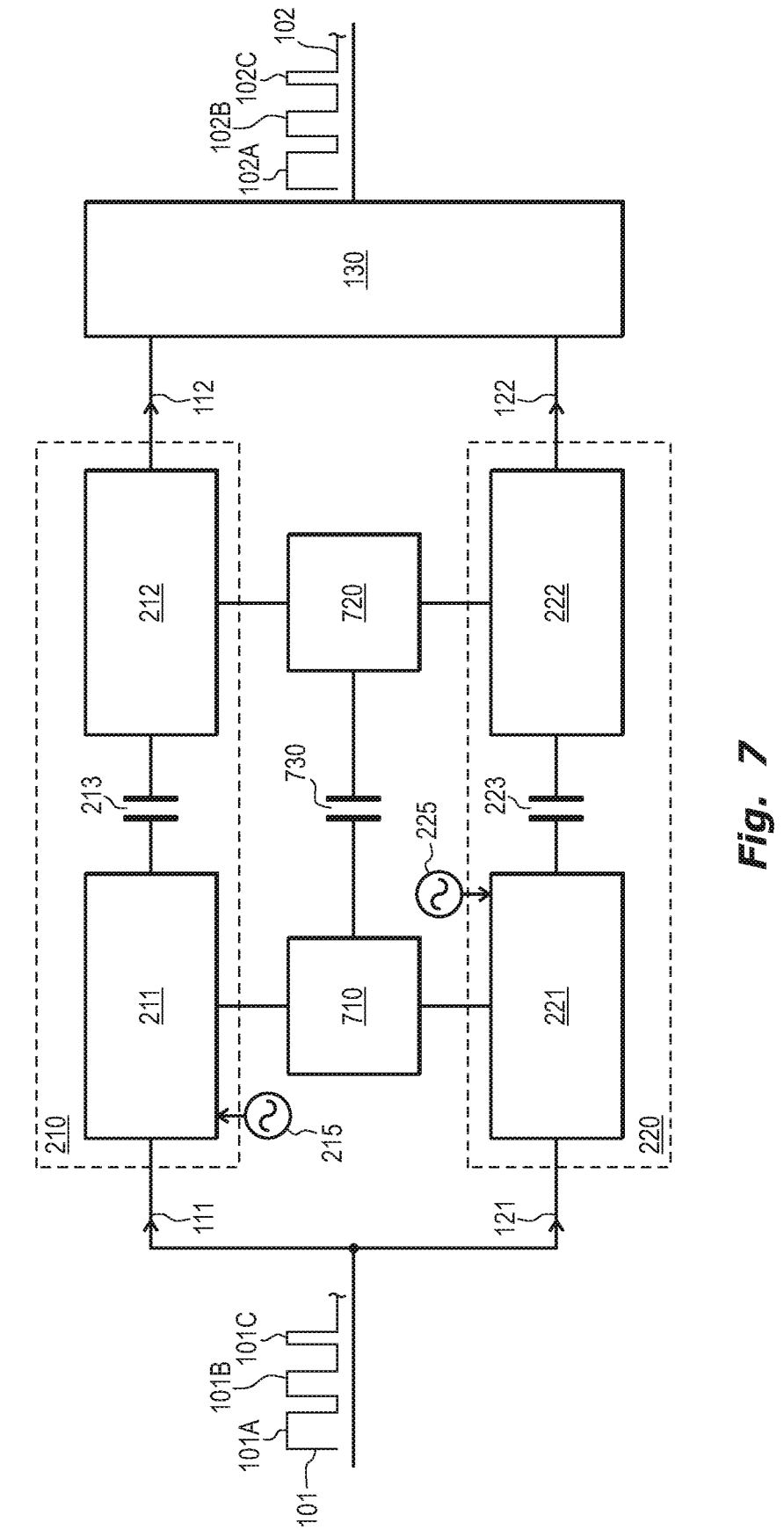
FIG. 7 illustrates an isolation driver circuit, which is an example of the isolation driver circuit of FIG. 2.

FIG. 7 illustrates an isolation driver circuit 700, which is an example of the isolation driver circuit 200 of FIG. 2. However, instead of using capacitors 214 and 224 to transmit individual common mode signals in the respective rising edge detection circuit 210 and falling edge detection circuit 220 of FIG. 2, the isolation driver circuit 700 uses a common mode transmitter 710 to generate a single combined common mode signal. This combined common mode signal is then transmitted from the common mode transmitter 710 to a common mode receiver 720 via a common mode capacitor 730. The combined common mode signal may then be used by both of the demodulators 212 and 222 to cancel unwanted noise that may occur in the respective modulated rising edge signal (e.g., modulated rising edge signal 302 in FIG. 3) and modulated falling edge signal (e.g., modulated falling edge signal 303 in FIG. 3). Accordingly, the demodulators 212 and 222 may more accurately generate the respective rising edge detection signals and falling edge detection signals a single combined common mode signal instead of individual common mode signals.

Accordingly, the isolation driver circuit, according to the principles described herein, allows for information represented in the pulse widths of an input pulse width modulated signal to be preserved with high fidelity within an output pulse width modulation signal. This is accomplished by using multiple clock signals to track rising edges and falling edges in the input pulse width modulated signal, and further by generating rising edges and falling edges in the output pulse width modulation signal that substantially temporally align with the respective rising edges and falling edges in the output pulse width modulation signal, according to the principles described herein.

Literal Support Section

Clause 1. An isolation driver circuit for a pulse width modulation signal, the isolation drive circuit comprising: a rising edge detection circuit configured to detect rising edges of an input pulse width modulation signal and output corresponding rising edge detection signals so as to be capacitively isolated from the input pulse width modulation signal; a falling edge detection circuit configured to detect falling edges of the input pulse width modulation signal, and output corresponding falling edge detection signals so as to be capacitively isolated from the input pulse width modulation signal; and a decoder configured to generate an output pulse width modulation signal by generating rising edges of the output pulse width modulation signal temporally corresponding to the detected rising edges of the input pulse width modulation signal, and by generating falling edges of the output pulse width modulation signal temporally corresponding to the detected falling edges of the input pulse width modulation signal.

Clause 2. The isolation driver circuit of Clause 1, the rising edge detection circuit comprising: a clock configured to be coherent with rising edges of the input pulse width modulation signal; a modulator configured to receive the input pulse width modulation signal and to modulate the input pulse width modulation signal using a clock signal from the clock, to thereby generate a modulated pulse width modulation signal; a capacitor; and a demodulator configured to receive the modulated pulse width modulation signal via the capacitor, and configured to demodulate the modulated pulse width modulation signal, to thereby generate a demodulated pulse width modulation signal, a rising edge of the demodulated pulse width modulation signal being one of the corresponding rising edge detection signals.

Clause 3. The isolation driver circuit of Clause 2, the clock being a first clock, the modulator being a first modulator, the modulated pulse width modulation signal being a first modulated pulse width modulation signal, the capacitor being a first capacitor, the demodulator being a first demodulator, the demodulated pulse width modulation signal being a first demodulated pulse width modulation signal, the falling edge detection circuit comprising: a second clock configured to be coherent with falling edges of the input pulse width modulation signal; a second modulator configured to receive the input pulse width modulation signal and to modulate the input pulse width modulation signal using a clock signal from the second clock, to thereby generate a second modulated pulse width modulation signal that is a modulation of an inverse of the input pulse width modulation signal; a second capacitor; and a second demodulator configured to receive via the second capacitor the second modulated pulse width modulation signal, and configured to demodulate the second modulated pulse width modulation signal to thereby generate a second demodulated pulse width modulation signal, a rising edge of the second demodulated pulse width modulation signal being one of the corresponding falling edge detection signals.

Clause 4. The isolation driver circuit of Clause 3, the rising edge detection circuit being a first rising edge detection circuit, the falling edge detection circuit being a first falling edge detection circuit, the decoder being a first decoder, the isolation driver circuit further comprising: a deadtime circuit configured to generate a complementary input pulse width modulation signal that is complementary with the input pulse width modulation signal but with some deadtime such that the input pulse width modulation signal and the complementary input pulse width modulation signal are not high at the same time; a second rising edge detection circuit configured to detect rising edges of the complementary input pulse width modulation signal and output corresponding complementary rising edge detection signals so as to be capacitively isolated from the complementary input pulse width modulation signal; a second falling edge detection circuit configured to detect falling edges of the complementary input pulse width modulation signal, and output corresponding complementary falling edge detection signals so as to be capacitively isolated from the complementary input pulse width modulation signal; and a second decoder configured to generate a complementary output pulse width modulation signal by generating rising edges of the complementary output pulse width modulation signal temporally corresponding to the detected rising edges of the complementary input pulse width modulation signal, and by generating falling edges of the complementary output pulse width modulation signal temporally corresponding to the detected falling edges of the complementary input pulse width modulation signal.

Clause 5. The isolation driver circuit of Clause 4, the second rising edge detection circuit comprising: a third clock configured to be coherent with rising edges of the complementary input pulse width modulation signal; a third modulator configured to receive the complementary input pulse width modulation signal and to modulate the complementary input pulse width modulation signal using a clock signal from the third clock, to thereby generate a third modulated pulse width modulation signal; a third capacitor; and a third demodulator configured to receive via the third capacitor the third modulated pulse width modulation signal, and configured to demodulate the third modulated pulse width modulation signal, to thereby generate a third demodulated pulse width modulation signal, a rising edge of the third demodulated pulse width modulation signal being one of the corresponding complementary rising edge detection signals.

Clause 6. The isolation driver circuit of Clause 5, the second falling edge detection circuit comprising: a fourth clock configured to be coherent with falling edges of the complementary input pulse width modulation signal; a fourth modulator configured to receive the complementary input pulse width modulation signal and to modulate the complementary input pulse width modulation signal using a clock signal from the fourth clock, to thereby generate a fourth modulated pulse width modulation signal; a fourth capacitor; and a fourth demodulator configured to receive via the fourth capacitor the fourth modulated pulse width modulation signal, and configured to demodulate the fourth modulated pulse width modulation signal, to thereby generate a fourth demodulated pulse width modulation signal that is a modulation of an inverse of the complementary input pulse width modulation signal, a rising edge of the fourth demodulated pulse width modulation signal being one of the corresponding complementary falling edge detection signals.

Clause 7. The isolation driver circuit of Clause 6, the isolation driver circuit further comprising: a first driver configured to output a high driver signal to a gate terminal of a first field-effect transistor when the first decoder generates a rising edge of the output pulse width modulation signal, and configured to output a low driver signal to the gate terminal of the first field-effect transistor when the first decoder generates a falling edge of the output pulse width modulation signal; and a second driver configured to output a high driver signal to a gate terminal of a second field-effect transistor when the second decoder generates a rising edge of the complementary output pulse width modulation signal, and configured to output a low driver signal to the gate terminal of the second field-effect transistor when the second decoder generates a falling edge of the complementary output pulse width modulation signal;

Clause 8. The isolation driver circuit of Clause 3, the isolation driver circuit further comprising a driver configured to output a high driver signal to a gate terminal of a field-effect transistor when the decoder generates a rising edge of the output pulse width modulation signal, and configured to output a low driver signal to the gate terminal of the field-effect transistor when the decoder generates a falling edge of the output pulse width modulation signal.

Clause 9. The isolation driver circuit of Clause 3, the isolation driver circuit further comprising a third capacitor, the first modulator further being configured to generate a common mode signal corresponding to the first modulated pulse width modulation signal, the first demodulator further being configured to receive the common mode signal via the third capacitor, and configured to generate the first demodulated pulse width modulation signal also using the common mode signal.

Clause 10. The isolation driver circuit of Clause 9, the common mode signal being a first common mode signal, the isolation driver circuit further comprising a fourth capacitor, the second modulator further being configured to generate a second common mode signal corresponding to the second modulated pulse width modulation signal, the second demodulator further being configured to receive the second common mode signal via the fourth capacitor, and configured to generate the second demodulated pulse width modulation signal also using the second common mode signal.

Clause 11. The isolation driver circuit of Clause 1, the isolation driver circuit further comprising: a deadtime circuit configured to generate a complementary input pulse width modulation signal that is complementary with the input pulse width modulation signal but with some deadtime such that the input pulse width modulation signal and the complementary input pulse width modulation signal are not high at the same time.

Clause 12. The isolation driver circuit of Clause 11, the rising edge detection circuit being a first rising edge detection circuit, the falling edge detection circuit being a first falling edge detection circuit, the decoder being a first decoder, the isolation driver circuit further comprising: a second rising edge detection circuit configured to detect rising edges of the complementary input pulse width modulation signal and output corresponding complementary rising edge detection signals so as to be capacitively isolated from the complementary input pulse width modulation signal; a second falling edge detection circuit configured to detect falling edges of the complementary input pulse width modulation signal, and output corresponding complementary falling edge detection signals so as to be capacitively isolated from the complementary input pulse width modulation signal; and a second decoder configured to generate a complementary output pulse width modulation signal by generating rising edges of the complementary output pulse width modulation signal temporally corresponding to the detected rising edges of the complementary input pulse width modulation signal, and by generating falling edges of the complementary output pulse width modulation signal temporally corresponding to the detected falling edges of the complementary input pulse width modulation signal.

Although the subject matter has been described in language specific to structural features and/or methodological acts, it is to be understood that the subject matter defined in the appended claims is not necessarily limited to the described features or acts described above, or the order of the acts described above. Rather, the described features and acts are disclosed as example forms of implementing the claims.

The present disclosure may be embodied in other specific forms without departing from its essential characteristics. The described embodiments are to be considered in all respects only as illustrative and not restrictive. All changes which come within the meaning and range of equivalency of the claims are to be embraced within their scope.

When introducing elements in the appended claims, the articles "a," "an," "the," and "said" are intended to mean there are one or more of the elements. The terms "comprising," "including," and "having" are intended to be inclusive and mean that there may be additional elements other than the listed elements.

What is claimed:

1. An isolation driver circuit for a pulse width modulation signal that isolates an input-side power supply and an output-side power supply, the isolation drive circuit comprising:

a rising edge detection circuit configured to detect rising edges of an input pulse width modulation signal powered by the input-side power supply, and in response output corresponding rising edge detection signals so as to be capacitively isolated from the input pulse width modulation signal and so to be powered by the output-side power supply;

a falling edge detection circuit configured to detect falling edges of the input pulse width modulation signal, and output corresponding falling edge detection signals so as to be capacitively isolated from the input pulse width modulation signal and so to be powered by the output-side power supply; and a decoder configured to generate an output pulse width modulation signal by generating rising edges of the output pulse width modulation signal temporally corresponding to the detected rising edges of the input pulse width modulation signal, and by generating falling edges of the output pulse width modulation signal temporally corresponding to the detected falling edges of the input pulse width modulation signal; the rising edge detection circuit comprising a clock configured to be coherent with rising edges of the input pulse width modulation signal;

a modulator configured to receive the input pulse width modulation signal and to modulate the input pulse width modulation signal using a clock signal from the clock, to thereby generate a modulated pulse width modulation signal;

20 a capacitor; and a demodulator configured to receive the modulated pulse width modulation signal via the capacitor, and configured to demodulate the modulated pulse width modulation signal, to thereby generate a demodulated pulse width modulation signal, a rising edge of the demodulated pulse width modulation signal temporally corresponding to one of the corresponding rising edge detection signals.

2. The isolation driver circuit of claim 1, the clock being a first clock, the modulator being a first modulator, the modulated pulse width modulation signal being a first modulated pulse width modulation signal, the capacitor being a first capacitor, the demodulator being a first demodulator, the demodulated pulse width modulation signal being a first demodulated pulse width modulation signal, the falling edge detection circuit comprising:

a second clock configured to be coherent with falling edges of the input pulse width modulation signal;

a second modulator configured to receive the input pulse width modulation signal and to modulate the input pulse width modulation signal using a clock signal from the second clock, to thereby generate a second modulated pulse width modulation signal that is a modulation of an inverse of the input pulse width modulation signal;

a second capacitor; and a second demodulator configured to receive via the second capacitor the second modulated pulse width modulation signal, and configured to demodulate the second modulated pulse width modulation signal to thereby generate a second demodulated pulse width modulation signal, a rising edge of the second demodulated pulse width modulation signal temporally corresponding to one of the corresponding falling edge detection signals.

3. The isolation driver circuit of claim 2, the rising edge detection circuit being a first rising edge detection circuit, the falling edge detection circuit being a first falling edge detection circuit, the decoder being a first decoder, the isolation driver circuit further comprising:

a deadtime circuit configured to generate a complementary input pulse width modulation signal powered by the input-side power supply, and that is complementary with the input pulse width modulation signal but with some deadtime such that the input pulse width modulation signal and the complementary input pulse width modulation signal are not high at the same time;

a second rising edge detection circuit configured to detect rising edges of the complementary input pulse width modulation signal, and in response output corresponding complementary rising edge detection signals so as to be capacitively isolated from the complementary input pulse width modulation signal and so to be powered by the output-side power supply;

a second falling edge detection circuit configured to detect falling edges of the complementary input pulse width modulation signal, and in response output corresponding complementary falling edge detection signals so as to be capacitively isolated from the complementary input pulse width modulation signal and so to be powered by the output-side power supply; and a second decoder configured to generate a complementary output pulse width modulation signal by generating rising edges of the complementary output pulse width modulation signal temporally corresponding to the detected rising edges of the complementary input pulse width modulation signal, and by generating falling edges of the complementary output pulse width modulation signal temporally corresponding to the detected falling edges of the complementary input pulse width modulation signal.

4. The isolation driver circuit of claim 3, the second rising edge detection circuit comprising:

a third clock configured to be coherent with rising edges of the complementary input pulse width modulation signal;

a third modulator configured to receive the complementary input pulse width modulation signal and to modulate the complementary input pulse width modulation signal using a clock signal from the third clock, to thereby generate a third modulated pulse width modulation signal;

a third capacitor; and a third demodulator configured to receive via the third capacitor the third modulated pulse width modulation signal, and configured to demodulate the third modulated pulse width modulation signal, to thereby generate a third demodulated pulse width modulation signal, a rising edge of the third demodulated pulse width modulation signal temporally corresponding to one of the corresponding complementary rising edge detection signals.

5. The isolation driver circuit of claim 4, the second falling edge detection circuit comprising:

a fourth clock configured to be coherent with falling edges of the complementary input pulse width modulation signal;

a fourth modulator configured to receive the complementary input pulse width modulation signal and to modulate the complementary input pulse width modulation signal using a clock signal from the fourth clock, to thereby generate a fourth modulated pulse width modulation signal;

a fourth capacitor; and a fourth demodulator configured to receive via the fourth capacitor the fourth modulated pulse width modulation signal, and configured to demodulate the fourth modulated pulse width modulation signal, to thereby generate a fourth demodulated pulse width modulation signal that is a modulation of an inverse of the complementary input pulse width modulation signal, a rising edge of the fourth demodulated pulse width modulation signal temporally corresponding to one of the corresponding complementary falling edge detection signals.

6. The isolation driver circuit of claim 5, the isolation driver circuit further comprising:

a first driver configured to output a high driver signal to a gate terminal of a first field-effect transistor when the first decoder generates a rising edge of the output pulse width modulation signal, and configured to output a low driver signal to the gate terminal of the first field-effect transistor when the first decoder generates a falling edge of the output pulse width modulation signal; and a second driver configured to output a high driver signal to a gate terminal of a second field-effect transistor when the second decoder generates a rising edge of the complementary output pulse width modulation signal, and configured to output a low driver signal to the gate terminal of the second field-effect transistor when the second decoder generates a falling edge of the complementary output pulse width modulation signal.

7. The isolation driver circuit of claim 2, the isolation driver circuit further comprising a driver configured to output a high driver signal to a gate terminal of a field-effect transistor when the decoder generates a rising edge of the output pulse width modulation signal, and configured to output a low driver signal to the gate terminal of the field-effect transistor when the decoder generates a falling edge of the output pulse width modulation signal.

8. The isolation driver circuit of claim 2, the isolation driver circuit further comprising a third capacitor, the first modulator further being configured to generate a common mode signal corresponding to the first modulated pulse width modulation signal, the first demodulator further being configured to receive the common mode signal via the third capacitor, and configured to generate the first demodulated pulse width modulation signal also using the common mode signal.

9. The isolation driver circuit of claim 8, the common mode signal being a first common mode signal, the isolation driver circuit further comprising a fourth capacitor, the second modulator further being configured to generate a second common mode signal corresponding to the second modulated pulse width modulation signal, the second demodulator further being configured to receive the second common mode signal via the fourth capacitor, and configured to generate the second demodulated pulse width modulation signal also using the second common mode signal.

10. An isolation driver circuit for a pulse width modulation signal that isolates an input-side power supply and an output-side power supply, supply, the isolation driver circuit comprising:

a rising edge detection circuit configured to detect rising edges of an input pulse width modulation signal powered by the input-side power supply, and in response output corresponding rising edge detection signals so as to be capacitively isolated from the input pulse width modulation signal and so to be powered by the output-side power supply;

a falling edge detection circuit configured to detect falling edges of the input pulse width modulation signal, and output corresponding falling edge detection signals so as to be capacitively isolated from the input pulse width modulation signal and so to be powered by the output-side power supply;

a decoder configured to generate an output pulse width modulation signal by generating rising edges of the output pulse width modulation signal temporally corresponding to the detected rising edges of the input pulse width modulation signal, and by generating falling edges of the output pulse width modulation signal temporally corresponding to the detected falling edges of the input pulse width modulation signal; and a deadtime circuit configured to generate a complementary input pulse width modulation signal powered by the input-side power supply, and that is complementary with the input pulse width modulation signal but with some deadtime such that the input pulse width modulation signal and the complementary input pulse width modulation signal are not high at the same time, wherein the rising edge detection circuit being a first rising edge detection circuit, the falling edge detection circuit being a first falling edge detection circuit, the decoder being a first decoder, the isolation driver circuit further comprising:

a second rising edge detection circuit configured to detect rising edges of the complementary input pulse width modulation signal, and in response output corresponding complementary rising edge detection signals so as to be capacitively isolated from the complementary input pulse width modulation signal and so to be powered by the output-side power supply;

a second falling edge detection circuit configured to detect falling edges of the complementary input pulse width modulation signal, and in response output corresponding complementary falling edge detection signals so as to be capacitively isolated from the complementary input pulse width modulation signal and so to be powered by the output-side power supply; and a second decoder configured to generate a complementary output pulse width modulation signal by generating rising edges of the complementary output pulse width modulation signal temporally corresponding to the detected rising edges of the complementary input pulse width modulation signal, and by generating falling edges of the complementary output pulse width modulation signal temporally corresponding to the detected falling edges of the complementary input pulse width modulation signal.

* * * * *